(12) United States Patent
Jiang et al.

(10) Patent No.: US 10,374,838 B2
(45) Date of Patent: Aug. 6, 2019

(54) IMAGE DISTORTION CORRECTION IN A WIRELESS TERMINAL

(71) Applicant: Futurewei Technologies, Inc., Plano, TX (US)

(72) Inventors: Hong Jiang, Kernersville, NC (US); Jamil Mark Forrester, Summerfield, NC (US); Zhihang Zhang, Cary, NC (US)

(73) Assignee: Futurewei Technologies, Inc., Plano, TX (US)

( * ) Notice: Subject to any disclaimer, the term of this patent is extended or adjusted under 35 U.S.C. 154(b) by 78 days.

(21) Appl. No.: 15/639,957

(22) Filed: Jun. 30, 2017

(65) Prior Publication Data

US 2019/0007240 A1 Jan. 3, 2019

(51) Int. Cl.
| | | |
|---|---|---|
| *H04B 17/14* | (2015.01) | |
| *H04L 25/03* | (2006.01) | |
| *H03F 3/19* | (2006.01) | |
| *H03F 3/24* | (2006.01) | |
| *H03G 3/30* | (2006.01) | |

(52) U.S. Cl.
CPC ......... *H04L 25/03006* (2013.01); *H03F 3/19* (2013.01); *H03F 3/245* (2013.01); *H03G 3/3042* (2013.01); *H03F 2200/336* (2013.01); *H03F 2200/451* (2013.01); *H04L 2025/0342* (2013.01)

(58) Field of Classification Search
CPC ......... H04L 1/205; H04L 27/16; H04L 25/03; H04L 25/03006; H03D 3/009; H04F 3/19; H03F 3/245; H03G 3/3042
USPC ................................................. 375/219–228
See application file for complete search history.

(56) References Cited

U.S. PATENT DOCUMENTS

| | | | | |
|---|---|---|---|---|
| 7,002,511 | B1* | 2/2006 | Ammar | G01S 7/032 342/118 |
| 7,155,180 | B2* | 12/2006 | Kim | H03C 3/403 455/114.2 |
| 7,319,724 | B2* | 1/2008 | Kishi | H04B 1/0014 375/296 |
| 7,570,923 | B2* | 8/2009 | Kiss | H04B 17/21 455/115.1 |
| 7,672,364 | B2* | 3/2010 | Kang | H04L 27/364 375/219 |

(Continued)

FOREIGN PATENT DOCUMENTS

| | | |
|---|---|---|
| CN | 102843321 A | 12/2012 |
| CN | 104247281 A | 12/2014 |
| CN | 104584499 A | 4/2015 |

OTHER PUBLICATIONS

J. Tubbax et al., "Compensation of Transmitter IQ Imbalance for OFDM Systems," Acoustics, Speech, and Signal Processing, 2004. Proceedings (ICASSP'04). IEEE International Conference vol. 2. IEEE, 2004, total 4 pages.

*Primary Examiner* — James M Perez
(74) *Attorney, Agent, or Firm* — Jinghua Karen Tang (57) ABSTRACT

A circuit in a wireless communications terminal/device and a method is described for reducing an image distortion. By measuring three gain mismatches of I path and Q path of a transceiver, and estimating a value of an IQ mismatch coefficient based on the three gain mismatches; and applying a measurement adjustment to the I path or the Q path based on the value of the IQ mismatch coefficient, the image distortion is reduced.

17 Claims, 8 Drawing Sheets

(56) References Cited

U.S. PATENT DOCUMENTS

| | | | | |
|---|---|---|---|---|
| 7,733,949 B2* | 6/2010 | Jin | H04B 17/354 | 375/221 |
| 7,873,340 B2* | 1/2011 | Li | H03F 1/0205 | 375/345 |
| 8,284,824 B1* | 10/2012 | Smaini | H04B 1/40 | 341/118 |
| 8,340,167 B2* | 12/2012 | Feng | H04B 17/21 | 375/226 |
| 8,422,610 B2* | 4/2013 | Santraine | H03D 3/009 | 375/233 |
| 8,665,938 B2* | 3/2014 | Yu | H04W 24/10 | 375/228 |
| 8,860,513 B1* | 10/2014 | Chong | H03K 3/0322 | 331/172 |
| 9,203,448 B2* | 12/2015 | Morita | H04B 1/0475 | |
| 9,806,919 B2* | 10/2017 | Midya | H04L 25/061 | |
| 9,847,802 B1* | 12/2017 | Farley | H04B 1/0483 | |
| 9,900,112 B1* | 2/2018 | Shteiman | H04B 17/12 | |
| 9,948,484 B2* | 4/2018 | Roh | H04L 25/06 | |
| 9,991,994 B1* | 6/2018 | Jiang | H04L 1/205 | |
| 10,057,795 B2* | 8/2018 | Starzer | H04W 24/06 | |
| 2004/0106380 A1* | 6/2004 | Vassiliou | H04B 17/14 | 455/73 |
| 2004/0116083 A1* | 6/2004 | Suzuki | H03F 1/3247 | 455/126 |
| 2005/0260949 A1* | 11/2005 | Kiss | H04B 17/21 | 455/67.14 |
| 2006/0035601 A1* | 2/2006 | Seo | H04B 1/40 | 455/78 |
| 2009/0010358 A1* | 1/2009 | Jaganathan | H04L 27/364 | 375/296 |
| 2010/0104045 A1* | 4/2010 | Santraine | H03D 3/009 | 375/324 |
| 2010/0277236 A1* | 11/2010 | Horiguchi | H03F 1/30 | 330/149 |
| 2011/0026570 A1* | 2/2011 | Feng | H04B 17/21 | 375/224 |
| 2013/0272175 A1* | 10/2013 | Zargari | H04L 5/14 | 370/281 |
| 2014/0134943 A1* | 5/2014 | Hobbs | H04B 7/15535 | 455/9 |
| 2014/0192923 A1* | 7/2014 | Matsuo | H01Q 3/2605 | 375/296 |
| 2014/0376660 A1* | 12/2014 | Chen | H04L 27/364 | 375/296 |
| 2015/0215150 A1* | 7/2015 | Chen | H04L 27/364 | 375/297 |
| 2015/0295749 A1* | 10/2015 | Ganesan | H04L 27/3863 | 375/345 |
| 2016/0359614 A1* | 12/2016 | Hao | H04L 7/033 | |
| 2017/0111191 A1* | 4/2017 | Midya | H04L 25/061 | |
| 2018/0124616 A1* | 5/2018 | Jiang | H04L 5/0048 | |
| 2019/0007240 A1* | 1/2019 | Jiang | H04L 25/03006 | |

* cited by examiner

IMAGE DISTORTION CORRECTION IN A WIRELESS TERMINAL

FIELD OF THE INVENTION

The present disclosure is related to image distortion correction and in particular to image distortion correction in a wireless terminal.

BACKGROUND

In a wireless terminal, e.g., cell phone, the image distortion is one key impairment that impacts the quality of the transmitting signal. Typically, radio frequency (RF) gain dependent image distortion is considered as a secondary effect hiding below other type of stronger image distortions. However, as the demand of higher data throughput increases, higher modulation scheme, e.g., uplink 256 quadrature amplitude modulation (QAM), requires even lower image distortion. In this scenario, RF gain dependent image distortion may become the dominant factor as other type of image distortions are removed.

SUMMARY

The present disclosure involves a circuit in a wireless communications terminal/device and a method for reducing RF gain dependent image distortion.

In some instances, one aspect of the subject matter described here may be implemented as a method performed by a wireless terminal including a transceiver. The method may include measuring, by the wireless terminal, a first gain mismatch of I path and Q path of the transceiver having a first RF gain setting, a second gain mismatch of I path and Q path of the transceiver having a second RF gain setting, and a third gain mismatch of I path and Q path of the transceiver having a third RF gain setting; estimating, a value of an IQ mismatch coefficient based on the first gain mismatch, the second gain mismatch and the third gain mismatch; and applying, by the wireless terminal, a measurement adjustment to the I path or the Q path based on the value of the IQ mismatch coefficient to reduce an image distortion.

In some instances, one aspect of the subject matter described here may be a wireless terminal including a digital baseband circuitry and a transceiver. The transceiver having a first RF gain setting is configured to send a first measurement to the digital baseband circuitry, the transceiver having a second RF gain setting is configured to send a second measurement to the digital baseband circuitry, and the transceiver having a third RF gain setting is configured to send a third measurement to the digital baseband circuitry. The digital baseband circuitry is configured to measure a first gain mismatch of I path and Q path of the transceiver based on the first measurement, a second gain mismatch of I path and Q path of the transceiver based on the second measurement, and a third gain mismatch of I path and Q path of the transceiver based on the third measurement. The digital baseband circuitry is further configured to estimate a value of an IQ mismatch coefficient based on the first gain mismatch, the second gain mismatch and the third gain mismatch, and apply a measurement adjustment to the I path or the Q path based on the value of the IQ mismatch coefficient.

In some instances, one aspect of the subject matter described here may be implemented as a digital baseband circuitry. The digital baseband circuitry includes a memory storing instructions; a processor coupled to the memory to execute the instructions to: measure a first gain mismatch of I path and Q path of a transceiver having a first RF gain setting, a second gain mismatch of I path and Q path of the transceiver having a second RF gain setting, and a third gain mismatch of I path and Q path of the transceiver having a third RF gain setting; estimate, a value of an IQ mismatch coefficient based on the first gain mismatch, the second gain mismatch and the third gain mismatch; and apply a measurement adjustment to the I path or the Q path based on the value of the IQ mismatch coefficient to reduce an image distortion.

As a result, the wireless terminal may estimate the adjustment needed between I path and Q path, and apply a measurement adjustment to I path or Q path based on the value of the IQ mismatch coefficient to reduce an image distortion.

BRIEF DESCRIPTION OF THE DRAWINGS

Like reference numbers and designations in the various drawings indicate like elements.

DETAILED DESCRIPTION

It should be understood at the outset that although an illustrative implementation of one or more embodiments are provided below, the disclosed circuits and/or methods may be implemented using any number of techniques, whether currently known or in existence. The disclosure should in no way be limited to the illustrative implementations, drawings, and techniques illustrated below, including the exemplary designs and implementations illustrated and described herein.

Typically, an image distortion is relatively insensitive to the change of the radio frequency (RF) amplifier gain. However, when uplink 256 quadrature amplitude modulation (QAM) support is required, the RF gain dependent image distortion may become the dominant factor, as all other type of image distortion are suppressed. Circuits and methods for reducing image distortion in a wireless terminal are described.

Figure 1:
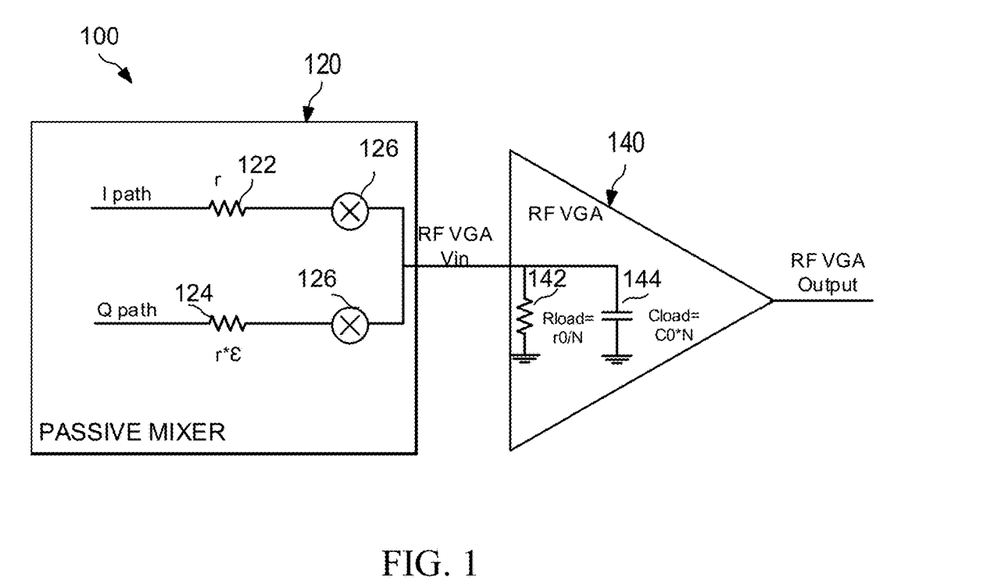
FIG. 1 is a conceptual drawing of a circuit 100 of a wireless communications terminal/device.

FIG. 1 is a conceptual drawing of circuit 100 in a wireless communications terminal/device. Circuit 100 includes passive mixer 120 and RF variable gain amplifier (VGA) 140. Passive mixer 120 includes resistor 122 at I path, resistor 124 at Q path, and mixer 126. The outputs of resistor 122 and resistor 124 are inputs of mixer 126. The value of resistor 122 equals to r, and the value of resistor 124 equals to r*ε. The output of passive mixer 120 is an input of RF VGA 140. RF VGA 140 includes $R_{load}$ (also spelled as $R_{load}$) 142 and $C_{load}$ (also spelled as $C_{load}$) 144. $R_{load}$ 142 and $C_{load}$ 144 are the effective loads looking into RF VGA 140. The value of $R_{load}$ 142 equals to r0/N, and the value of $C_{load}$ 144 equals to C0*N, where N is the device size and determined by RF VGA gain setting. Assume N=1, 2 . . . 10 . . . , r0 represents the value of $R_{load}$ when N=1. Or, r0 is determined by a circuit design and is a constant value. Similarly, assume N=1, 2 . . . 10 . . . , C0 represents the value of $C_{load}$ when N=1. Or, C0 is determined by a circuit design and is a constant value.

In FIG. 1, if 1 represents the gain of I path, gs represents the gain of Q path, gs may represent the static gain mismatch (e.g., from LO signal or low pass filter). If there is no static gain mismatch (gs=1), in an ideal case, ε is 1, which means I path and Q path are balanced regardless of the load (r0/N) from VGA 140. However if ε is not equal to 1 due to chip process variation, not only it may create gain/phase mismatch, but also the gain/phase mismatch is VGA gain dependent due to the variation of N.

Looking at the gain of I path:

$$Gain_I = \frac{r0/N}{r+r0/N} \quad \text{Eq (1)}$$

Looking at the gain of Q path:

$$Gain_q = gs * \frac{r0/N}{r*\varepsilon+r0/N} \quad \text{Eq (2)}$$

This leads to the gain mismatch to be $$Gmis = \frac{Gain_q}{Gain_I} = gs * \frac{1+R*N}{1+R*N*\varepsilon} \quad \text{Eq (3)}$$

where R=r/r0, r represents a value of resistor 122; r0 represents a value of $R_{load}$ when N=1, or, r0 may be determined by a circuit design and is a constant value; ε represents a value of an IQ mismatch coefficient, and gs represents a value of a static gain mismatch coefficient.

From Eq (3), the gain mismatch Gmis changes when RF VGA gain changes (i.e., N changes), which is the root cause of RF gain dependent image distortion.

Based on Eq (3), there are three variables or coefficients (gs, ε and R). In order to determine the value ε of the IQ mismatch coefficient, three gain mismatches, such as Gmis1, Gmis2, and Gmis3, at different RF gain settings (corresponding to N1, N2 and N3) need to be measured.

As described above, in a typical quadrature transmitter with a passive mixer such as passive mixer 120, the analog section mismatch between I path and Q path may be seen at the radio frequency (RF) variable gain amplifier (VGA) input, because passive mixer 120 provides little isolation. The I path and Q path mismatch (i.e., IQ mismatch) combining with different RF VGA input load impedance (when RF VGA gain is changed) may create RF gain dependent IQ mismatch, i.e., image distortion. This is the root cause of RF gain dependent image distortion. It is desirable to eliminate or otherwise reduce the image distortion caused by IQ mismatch, especially for carrier-aggregation that is envisioned by industry to address the increasing demand from service providers for higher mobile data throughput. After this root cause is recognized, variable resistors are added at the input of a mixer. Based on a calibration theory (will describe below), the values of the variable resistors may be selected on I path and Q path to remove or reduce the analog IQ mismatch, thus remove or reduce RF gain dependent image distortion.

In some aspects, circuits and computer-implemented methods for reducing image distortion caused by IQ mismatch are described. The described techniques may estimate and reduce the distortions caused by the IQ mismatch. Reducing or adjusting the distortions caused by the IQ mismatch may include cancelling, removing, eliminating, correcting, or otherwise adjusting the distortions from the actual received signal so as to mitigate or eliminate the impact of the IQ mismatch on RF gain dependent image.

Figure 2:
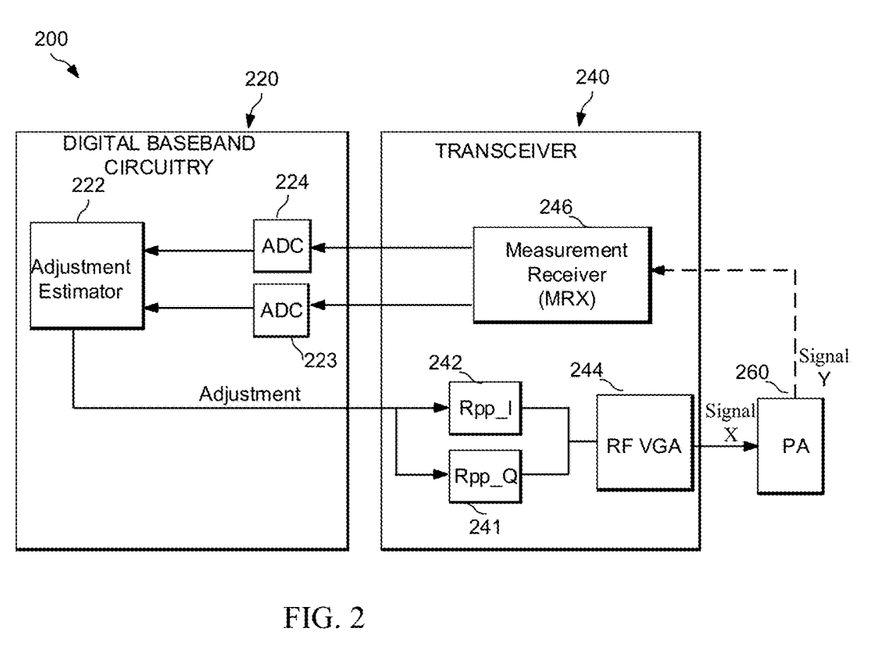
FIG. 2 is a block diagram showing an example circuit 200 of a wireless communications terminal/device.

FIG. 2 shows an example block diagram of a circuit 200 in a wireless communications terminal/device. Although other circuitry/components may be included in the wireless communications terminal/device, only those portions necessary and relevant for an understanding of the present disclosure are shown therein.

As shown in FIG. 2, circuit 200 includes digital baseband circuitry 220, transceiver 240, and power amplifier (PA) 260. Digital baseband circuitry 220 provides adjustments to I path and Q path of transceiver 240. Transceiver 240 (which includes measurement receiver 246) converts the analog I and Q signals to a radio-frequency (RF) signal "X." RF signal X is an input to PA 260 for amplification to generate an RF signal Y at a power level required for transmission from an antenna (not shown) of circuit 200. Transceiver 240 receives RF signal Y from PA 260, and provides measurements to digital baseband circuitry 220 as inputs of adjustment estimator 222 in digital baseband circuitry 220.

Within digital baseband circuitry 220, analog-to-digital converter (ADC) 224 converts a measurement received from transceiver 240 to a digital signal, and the digital signal is an input of adjustment estimator 222. Similarly, ADC 223 converts a measurement received from transceiver 240 to a digital signal, and the digital signal is another input of adjustment estimator 222. The output of adjustment estimator 222 provides adjustments to I and Q paths.

Within transceiver 240, variable resistors 241 and 242 at an input of RF VGA 244 are introduced. Rpp_I is variable resistor 242 at I path, and Rpp_Q is variable resistor 241 at Q path. An adjustment to Rpp_I 242 may be independent of an adjustment to Rpp_Q 241. This variable resistor (Rpp_I or Rpp_Q) may be used to offset the mismatch caused by the process variation. A calibration (such as, a factory calibration) is needed to estimate the mismatch between I path and Q path, and then proper compensation may be applied by applying different codes for Rpp_I 242 and Rpp_Q 241 in order to balance I path and Q path, which will suppress the RF gain dependent image distortion. Rpp_I 242 and Rpp_Q 241 provide input signals to RF VGA 244. RF VGA 244 converts the analog I and Q signals to a radio-frequency (RF) signal "X." Measurement receiver (MRX) 246 receives RF signal Y from PA 260, and provides measurements to adjustment estimator 222 via ADC 224 and ADC 223 as inputs of the adjustments.

Below to introduce the calibration theory:

Assuming R*N*E equals to a small value, from Eq (3), $$Gmis \approx gs*(1+R*N)*(1-R*N*\varepsilon) = gs(1+R*N-R*N*\varepsilon R*N^2*\varepsilon) \quad \text{Eq (4)}$$

Since $R*N^2*\varepsilon$ equals to a smaller value, from Eq (4)

$$Gmis \approx gs*(1+R*N*\Delta), \text{ where } \Delta=1-\varepsilon \quad \text{Eq (5)}$$

Make a first measurement with a first RF VGA gain setting (corresponding to N1), from Eq (5), $$Gmis1 = gs*(1+R*N1*\Delta) \qquad \text{Eq (6)}$$

Make a second measurement with a second RF VGA gain setting (corresponding to N2), from Eq (5), $$Gmis2 = gs*(1+R*N2*\Delta) \qquad \text{Eq (7)}$$

From Eq (6) and Eq (7), $$gs = \frac{Gmis1*N2 - Gmis2*N1}{N2 - N1} \qquad \text{Eq (8)}$$

From Eq (8), the value gs is obtained based on the measurement results of N1 and N2. Adjustment estimator 222 makes a third measurement with a third RF VGA gain setting (corresponding to N3). With gs known from Eq (8), the value of the IQ mismatch coefficient E may be derived based on N1 and N3 measurement results (or based on N2 and N3 measurement results).

Take measurement results N1 and N3 as an example. The gs may be used to define G=Gmis/gs. By using the measurement result at the first RF gain settings (N1), and from Eq (3):

$$G1 = \frac{1 + R*N1}{1 + R*N1*\varepsilon} \qquad \text{Eq (9)}$$

By using the measurement result at the third RF gain settings (N3), and from Eq (3):

$$G3 = \frac{1 + R*N3}{1 + R*N3*\varepsilon} \qquad \text{Eq (10)}$$

Using the two equations Eq (9) and Eq (10) to solve ε:

$$G1+G1*R*N1*\varepsilon = 1+R*N1 \qquad \text{Eq (11)}$$

$$G3+G3*R*N3*\varepsilon = 1+R*N3 \qquad \text{Eq (12)}$$

From Eq (11), $$G1-1 = (G1-\varepsilon)*R*N1 \qquad \text{Eq (13)}$$

From Eq (12), $$G3-1 = (G3-\varepsilon)*R*N3 \qquad \text{Eq (14)}$$

From Eq (13) and Eq (14), $$\frac{G1-1}{G3-1} * \frac{N3}{N1} = \frac{G1-\varepsilon}{G3-\varepsilon} \qquad \text{Eq (15)}$$

$$\text{If defining } a = \frac{G1-1}{G3-1} * \frac{N3}{N1}, \text{ then } \varepsilon = \frac{a*G3 - G1}{a - 1} \qquad \text{Eq (16)}$$

From Eq (16), ε is derived. With the estimated ε, proper adjustment may be applied to Rpp_I or Rpp_Q to remove the imbalance.

The mismatch value ε may be estimated in the factory calibration phase. Alternatively or additionally, the mismatch value may be estimated in other operation phases, such as during the transmission of data traffic by the wireless terminal. Based on the mismatch value, an adjustment signal may be generated to estimate any ensuing distortions caused by IQ mismatch and remove it from the image distortion. Typically, spread N1, N2 and N3 across the whole RF gain control range will yield better estimation.

Figure 3:
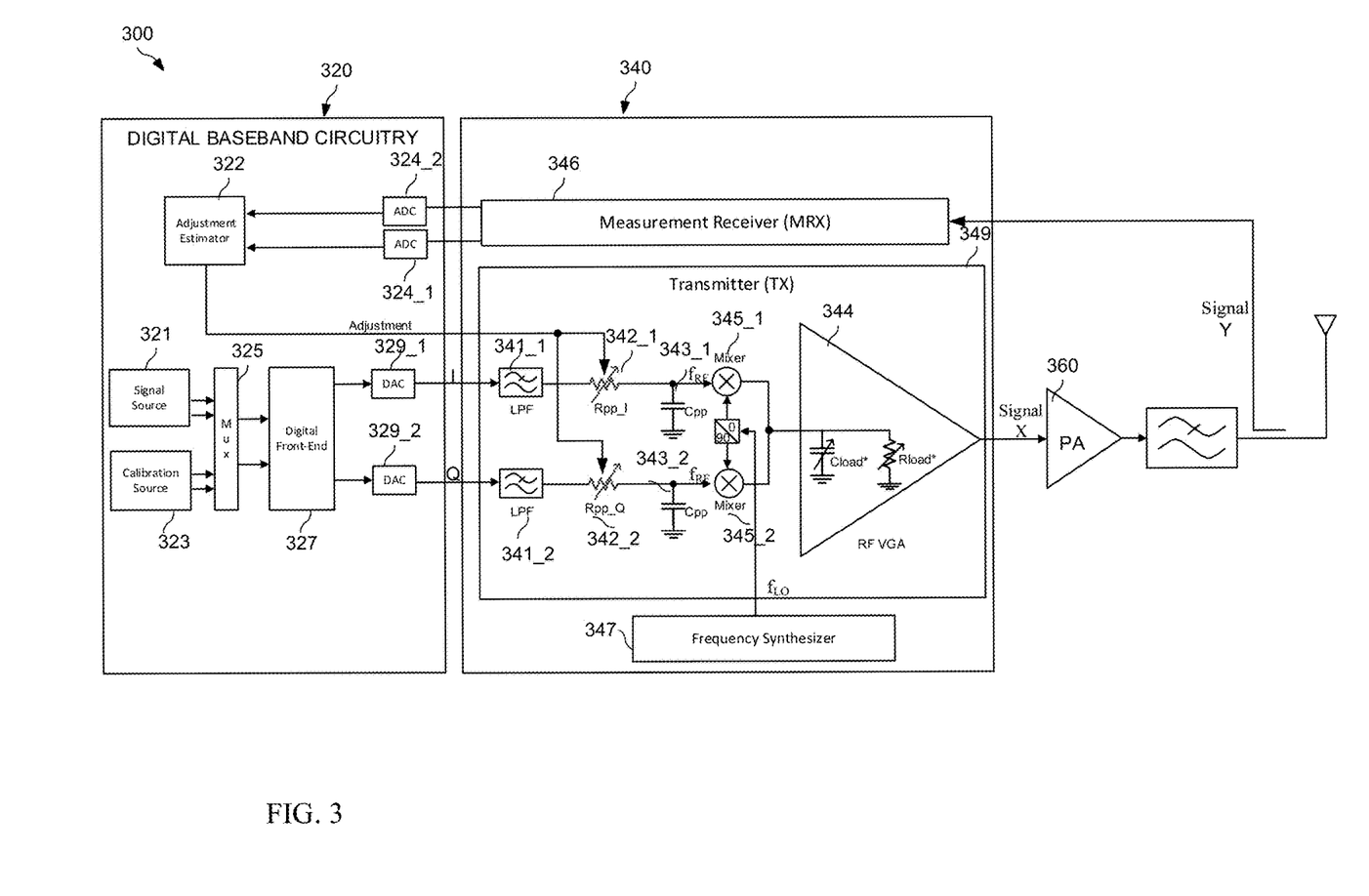
FIG. 3 is a block diagram showing an example circuit 300 of a wireless communications terminal/device.

FIG. 3 shows an example block diagram of a circuit 300 in a wireless communications terminal/device. Although other circuitry/components may be included in the wireless communications terminal/device, only those portions necessary and relevant for an understanding of the present disclosure are shown therein.

As shown in FIG. 3, circuit 300 includes digital baseband circuitry 320, transceiver 340, and power amplifier (PA) 360. Digital baseband circuitry 320 provides adjustments to I path and Q path of transceiver 340. Transceiver 340 (which includes measurement receiver 346) converts analog I and Q signals to a radio-frequency (RF) signal "X." RF signal X is an input to PA 360 for amplification to generate an RF signal Y at a power level required for transmission from an antenna of circuit 300. Transceiver 340 receives RF signal Y from PA 360, and provides measurements to digital baseband circuitry 320 as inputs of adjustment estimator 322 via analog-to-digital converter (ADC) 324_1 and ADC 324_2.

Within digital baseband circuitry 320, signal source 321 or calibration source 323 generate and feed baseband signals to multiplexer switch (MUX) 325. Since there is only one digital front-end 327, it is necessary to use MUX 325 to decide which source will be sampled. The output of MUX 325 is coupled with digital front-end 327 that may perform impairment adjustments, digital gain control or any other appropriate operations in the baseband. The signal outputs from digital front-end 327 may be transmitted to digital-to-analog converter (DAC) 329_1, and DAC 329_2. The converted signal from DAC 329_1 is then passed through low pass filter (LPF) 341_1, and the converted signal from DAC 329_2 is then passed through LPF 341_2.

ADC 324_1 and ADC 324_2 converts measurements received from transceiver 340 to digital signals that serve inputs to adjustment estimator 322. Based on the calibration theory introduced above, adjustment estimator 322 estimates the mismatch between I and Q paths, estimates adjustments needed between I and Q paths, and controls the transceiver accordingly.

Within the transceiver 340, there are dual paths in transmitter (TX) 349, one is I path, and the other one is Q path. Low pass filter (LPF) 341_1 receives an analog signal from DAC 329_1 of digital baseband circuitry 320, and LPF 341_2 receives an analog signal from DAC 329_2. LPF 341_1 and 341_2 are filters that pass signals with a frequency lower than a certain cutoff frequency and attenuates signals with frequencies higher than the cutoff frequency. Separate resistors Rpp_I 342_1 and Rpp_Q 342_2 are variable resistors. This variable resistor (Rpp_I or Rpp_Q) may be used to offset the mismatch caused by the process variation. The adjustment to Rpp_I 342_1 may be independent of the adjustment to Rpp_Q 342_2. For example, proper compensation may be applied by applying different codes for Rpp_I 342_1 and Rpp_Q 342_2 in order to balance I path and Q path. With I path and Q path balanced, the RF gain dependent image distortion will be suppressed. Rpp_I 342_1 provides input signals to mixer 345_1. Rpp_Q 342_2 provides input signals to mixer 345_2. Cpp 343-1 and Cpp 343_2 are two capacitances. Mixer 345_1 takes an RF input signal at a frequency $f_{RF}$ received from Rpp_I 342_1 at I path, mixes it with a low (LO) signal at a frequency $f_{LO}$ received from frequency synthesizer 347. Similarly, mixer 345_2 takes an RF input signal at a frequency $f_{RF}$ received from Rpp_Q 342_2 at Q path, mixes it with the LO signal at the frequency $f_{LO}$ received from frequency synthesizer 347. Mixer 345_1 and mixer 345_2 produces output signals that consist of the sum and difference frequencies, $f_{RF} \pm f_{LO}$ to RF VGA 344. RF VGA 344 converts analog I and Q signals ($f_{RF} \pm f_{LO}$) to a radio-frequency (RF) signal "X," and passes RF signal "X" to PA 360. Measurement receiver (MRX) 346 receives RF signal Y from PA 360, and provides measurements that server inputs to adjustment estimator 322 via ADC 324_1 and ADC 324_2.

In FIG. 3, two variable resistors 342_1 and 342_2 are added at inputs of the mixers 345_1 and 345_2 separately. According to the calibration theory, adjustment estimator 322 estimates adjustment needed between I and Q paths and controls transceiver 340 accordingly. As such, the optimal resistor values may be selected on I and Q paths to remove or reduce the analog IQ mismatch, thus removing or reducing RF gain dependent image distortion.

Figure 4:
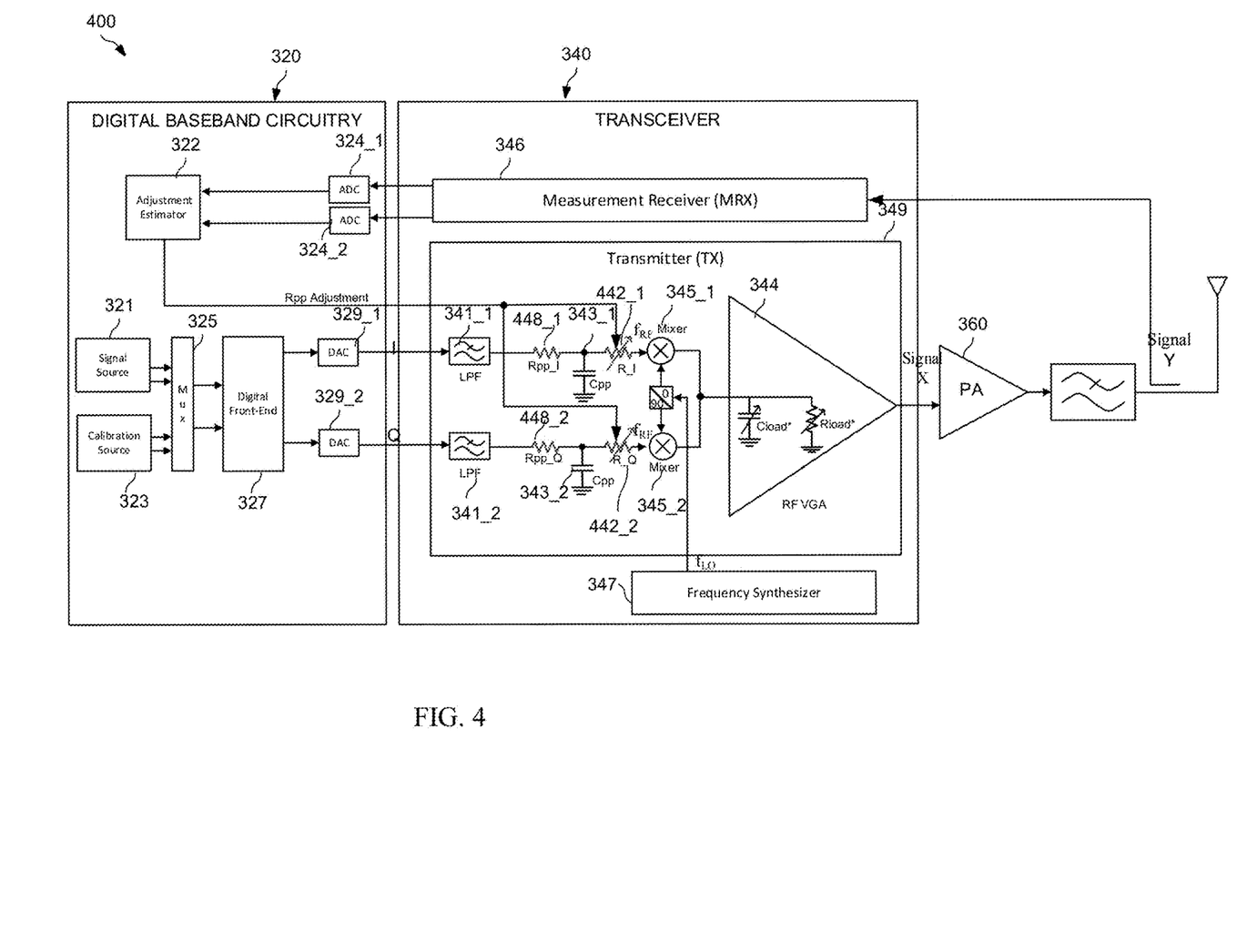
FIG. 4 is a block diagram showing an example circuit 400 of a wireless communications terminal/device.

FIG. 4 shows an example block diagram of a circuit 400 in a wireless communications terminal/device. Although other circuitry/components may be included in the wireless communications terminal/device, only those portions necessary and relevant for an understanding of the present disclosure are shown therein. The circuit 400 shown in FIG. 4 differs from the circuit 300 shown in FIG. 3 in that variable resistors R_I 442_1 and R_Q 442_2 are added. Instead, Rpp_I 448_1 and Rpp_Q 448_2 are fixed resistors. In another example, Rpp_I 448_1 and Rpp_Q 448_2 may be variable resistors. When mixer "On", resistance (Ron) is the dominant source of IQ mismatch, i.e., resistance (Ron) of I path is different from resistance (Ron) of Q path, adjusting Rpp_I 342_1 and Rpp_Q 342_2 as proposed above may introduce some small baseband frequency dependent image error. In this case, variable resistors (R_I 442_1 and R_Q 442_2 as shown in FIG. 4) may be added as the adjustment elements. By adjusting R_I 442_1 and R_Q 442_2, in an ideal case, perfect balance may be achieved between I path and Q path.

Figure 5:
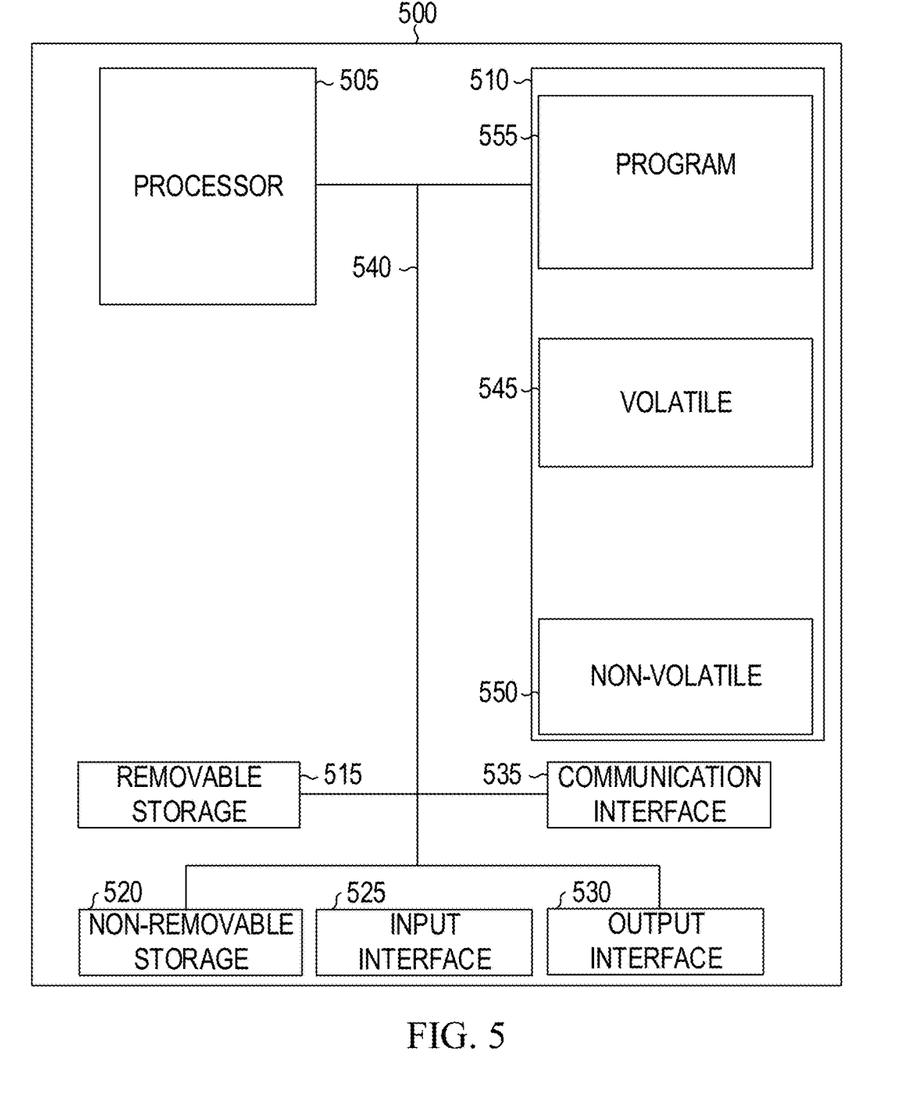
FIG. 5 is a block diagram illustrating an example digital baseband circuitry for implementing algorithms and performing methods.

FIG. 5 is a block diagram illustrating circuitry for implementing algorithms and performing methods, according to example embodiments. One example digital baseband circuitry, such as the digital baseband circuitry 220, or 320, may include a processor 505, memory storage 510, removable storage 515, and non-removable storage 520, all connected by a bus 540. The memory storage 510 may include volatile memory 545 and non-volatile memory 550, and may store a program 555. Digital baseband circuitry 500 may include, or have access to, a computing environment that includes a variety of computer-readable media, such as the volatile memory 545, the non-volatile memory 550, the removable storage 515, and the non-removable storage 520. Computer storage includes random-access memory (RAM), read-only memory (ROM), erasable programmable read-only memory (EPROM) and electrically erasable programmable read-only memory (EEPROM), flash memory or other memory technologies, compact disc read-only memory (CD ROM), digital versatile disks (DVD) or other optical disk storage, magnetic cassettes, magnetic tape, magnetic disk storage or other magnetic storage devices, or any other medium capable of storing computer-readable instructions.

Digital baseband circuitry 500 may include or have access to a computing environment that includes an input interface 525, an output interface 530, and a communication interface 535. The output interface 530 may interface to or include a display device, such as a touchscreen, that also may serve as an input device. The input interface 525 may interface to or include one or more of a touchscreen, a touchpad, a mouse, a keyboard, a camera, one or more device-specific buttons, one or more sensors integrated within or coupled via wired or wireless data connections to the digital baseband circuitry 500, and other input devices. Digital baseband circuitry 500 may operate in a networked environment using the communication interface 535 to connect to one or more remote computers, such as database servers. The remote computer may include a personal computer (PC), server, router, network PC, peer device or other common network node, or the like. The communication interface 535 may connect to a local-area network (LAN), a wide-area network (WAN), a cellular network, a WiFi network, a Bluetooth network, or other networks.

Computer-readable instructions stored on a computer-readable medium (e.g., the program 555 stored in the memory storage 510) are executable by the processor 505 of digital baseband circuitry 500. The program 555, when executed by the processor, configures processor 505 to measure a first gain mismatch of I path and Q path of a transceiver having a first RF gain setting, a second gain mismatch of I path and Q path of the transceiver having a second RF gain setting, and a third gain mismatch of I path and Q path of the transceiver having a third RF gain setting; estimate, a value of an IQ mismatch coefficient based on the first gain mismatch, the second gain mismatch and the third gain mismatch; and apply a measurement adjustment to the I path or the Q path based on the value of the IQ mismatch coefficient to reduce an image distortion. The detailed actions may refer to FIGS. 6 and 7.

A hard drive, CD-ROM, and RAM are some examples of articles including a non-transitory computer-readable medium such as a storage device. The terms "computer-readable medium" and "storage device" do not include carrier waves to the extent that carrier waves are deemed too transitory. "Computer-readable non-transitory media" includes all types of computer-readable media, including magnetic storage media, optical storage media, flash media, and solid-state storage media. It should be understood that software can be installed in and sold with a computer. Alternatively, the software can be obtained and loaded into the computer, including obtaining the software through a physical medium or distribution system, including, for example, from a server owned by the software creator or from a server not owned but used by the software creator. The software can be stored on a server for distribution over the Internet, for example.

Figure 6:
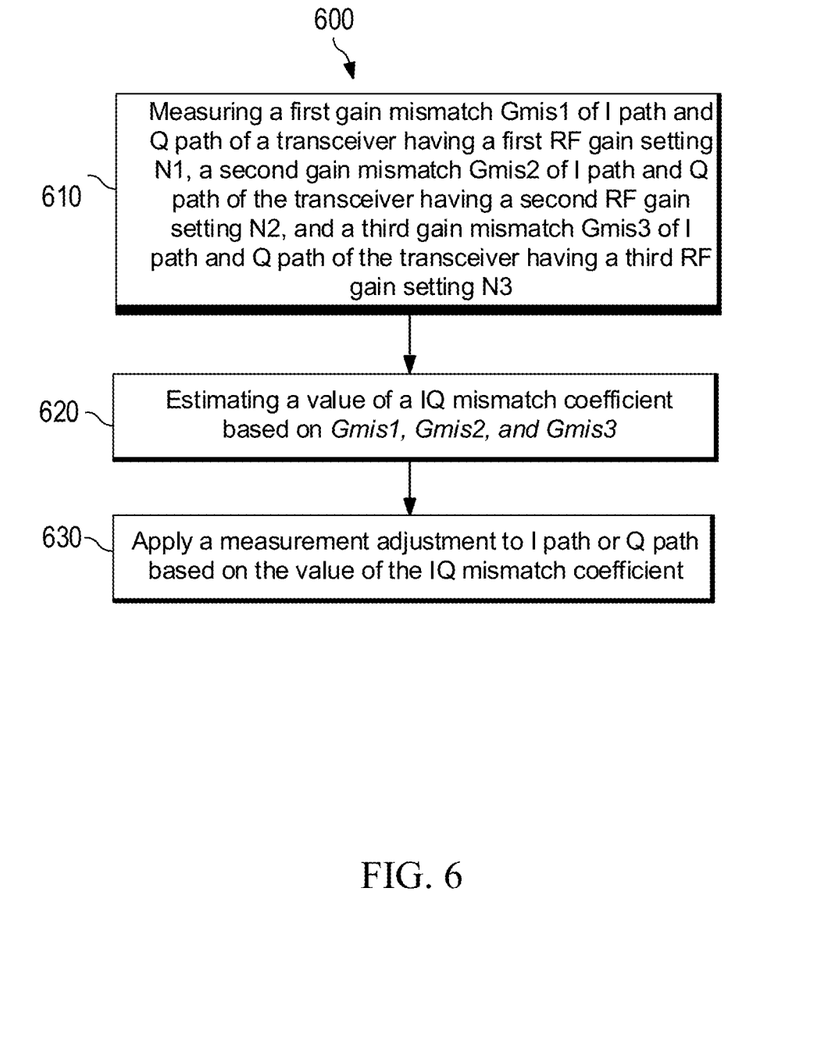
FIG. 6 is a flow chart illustrating an example process 600 for reducing an image distortion caused by IQ mismatch.

FIG. 6 is a flow chart illustrating an example process 600 for reducing imagine distortion caused by IQ path mismatch. The process 600 may be implemented as computer instructions stored on computer-readable media (for example, the computer-readable medium) and executable by data processing apparatus (for example, processors) of a wireless terminal in a communication network. In some implementations, the example process 600 may be implemented as software, hardware, firmware, or a combination thereof. As an example, the process 600 may be implemented as the adjustment estimator in FIGS. 2-5. The example process 600, individual operations of the process 600, or groups of operations may be iterated or performed simultaneously (e.g., using multiple threads). In some cases, the example process 600 may include the same, additional, fewer, or different operations performed in the same or a different order.

Before measuring the gain mismatch, transmitter is turned on and continuous-wave (CW) source is set as calibration source. At 610, the adjustment estimator measures a first gain mismatch Gmis1 of I path and Q path of a transceiver having a first RF gain setting N1, a second gain mismatch Gmis2 of I path and Q path of the transceiver having a second RF gain setting N2, and a third gain mismatch Gmis3 of I path and Q path of the transceiver having a third RF gain setting N3. N1, N2 and N3 are determined by a device size and different RF VGA gain setting.

The wireless terminal may transmit a first signal by a transmitter (TX) of the wireless terminal. For example, calibration source 323 may be set as a source to transmit the first signal. The wireless terminal may be a user device, user equipment, a base station, a relay station, or other network components in a communication network. The wireless terminal is configured to transmit and receive wireless signals. Example wireless terminals include a cellular phone, a smart phone, a tablet, a computer, a computer work station, a server, a router, a base station, etc.

In some implementations, the wireless terminal may include more than one TX and/or RX. For example, the wireless terminal may operate in an LTE inter-band carrier aggregation (CA) mode and may be configured to transmit and receive wireless signals in different frequency bands using more than one TX and/or RX.

The first signal may be a training signal, pilot signal, or other test signal that is transmitted by the TX and made known by a RX of the wireless terminal for the purpose of estimating the image distortion. For example, the first signal may be transmitted in a factory calibration phase. In some implementations, the first signal may be a signal that includes data traffic or control information and is transmitted during the operation of the wireless terminal.

A second signal is detected by a MRX of the wireless terminal. The MRX may be one of multiple MRXs of the wireless terminal. The second signal may include distortion caused to the first signal by an IQ path mismatch. After an analog-to-digital converter converts the second signal, the converted signal is passed to an adjustment estimator. The adjustment estimator may measure a gain mismatch Gmis based on the second signal. As such, with different gain setting, the adjustment estimator may measure Gmis1 at N1, Gmis2 at N2, and Gmis3 at N3.

At 620, according to the calibration theory, the adjustment estimator estimates an IQ mismatch coefficient $\varepsilon$ based on Gmis1, Gmis2 and Gmis3.

In some implementations, the IQ mismatch coefficient $\varepsilon$ estimated in a factory calibration phase, or during operations of the wireless terminal.

At 630, the adjustment estimator applies a measurement adjustment to I path or Q path based on the value of $\varepsilon$ to reduce the image distortion. The adjustment estimator tries to adjust $\varepsilon$ close to 1 by constructing an adjustment signal, and applying the adjustment signal to a variable resistor of I path or Q path. For example, the adjustment signal may be constructed according to Eq (3), as a linear combination.

Figure 7:
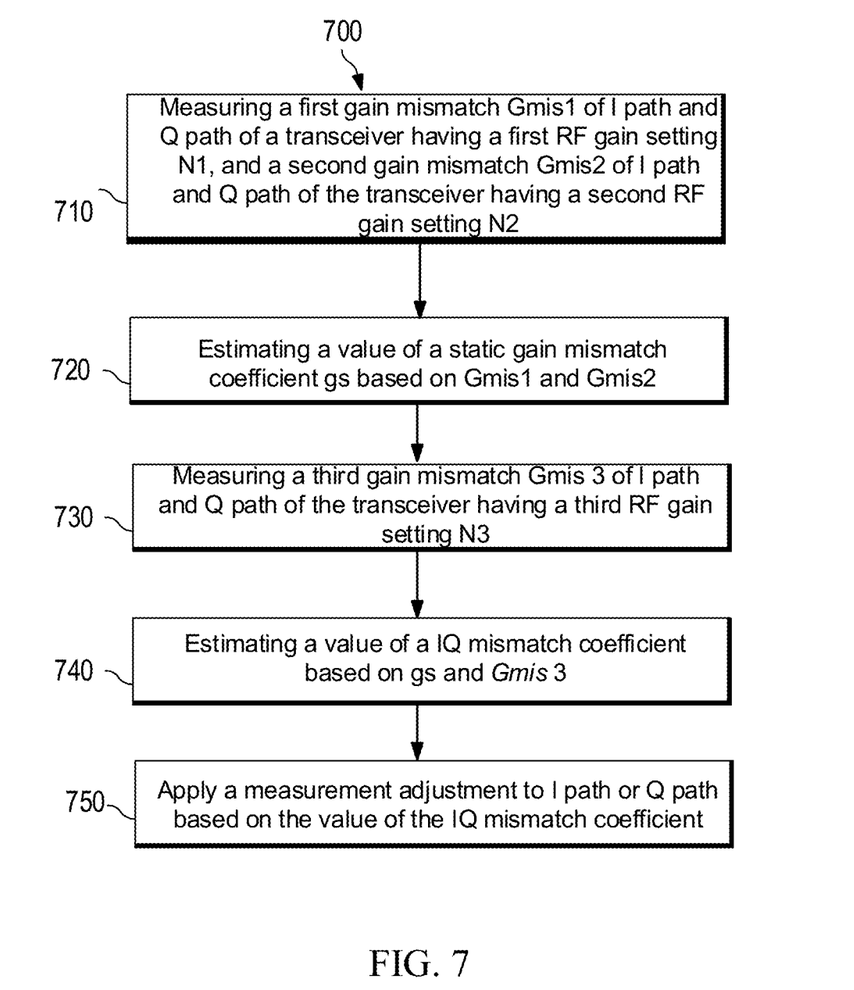
FIG. 7 is a flow chart illustrating an example process 700 for reducing an image distortion caused by IQ mismatch.

FIG. 7 is a flow chart illustrating an example process 700 for reducing imagine distortion caused by IQ path mismatch. The process 700 may be implemented as computer instructions stored on computer-readable media (for example, the computer-readable medium) and executable by data processing apparatus (for example, processors) of a wireless terminal in a communication network. In some implementations, the example process 700 may be implemented as software, hardware, firmware, or a combination thereof. As an example, the process 700 may be implemented as the adjustment estimator in FIGS. 2-5. The example process 700, individual operations of the process 700, or groups of operations may be iterated or performed simultaneously (e.g., using multiple threads). In some cases, the example process 700 may include the same, additional, fewer, or different operations performed in the same or a different order.

Before measuring the gain mismatch, transmitter is turned on and continuous-wave (CW) source is set as calibration source. Similar to 610 in FIG. 6, at 710, the adjustment estimator measures a first gain mismatch Gmis1 of I path and Q path of a transceiver having a first RF gain setting N1, and a second gain mismatch Gmis2 of I path and Q path of the transceiver having a second RF gain setting N2. N1 and N2 are determined by a device size and different RF VGA gain setting.

At 720, according to Eq (8), the adjustment estimator estimates a value of a static gain mismatch coefficient gs based on Gmis1 and Gmis2, N1 and N2.

In some implementations, the static gain mismatch coefficient gs is estimated in a factory calibration phase, or during operations of the wireless terminal. For example, in the latter case, the gs may be calibrated, updated, or otherwise adjusted on the fly during operations of the wireless terminal, for example, to provide a more accurate and up-to-date estimation of the distortion coefficient to reflect any condition changes of the TX and RX of the wireless terminal.

At 730, similar to step 710, a third gain mismatch Gmis3 at third RF gain setting N3 is measured. Gmis3 may be measured at step 710 or 730. It means Gmis3 may be measured after gs is deprived (step 730) or before gs is deprived (step 710).

At 740, according to Eq (16), the adjustment estimator estimates an IQ mismatch coefficient $\varepsilon$ based on gs, Gmis3 and Gmis1. Similar to Eq (16), the adjustment estimator may also estimate the IQ mismatch coefficient $\varepsilon$ based on gs, Gmis3 and Gmis2.

In some implementations, the IQ mismatch coefficient gs $\varepsilon$ estimated in a factory calibration phase, or during operations of the wireless terminal.

At 750, the adjustment estimator applies a measurement adjustment to I path or Q path based on the value of $\varepsilon$ to reduce the image distortion. The adjustment estimator tries to adjust $\varepsilon$ close to 1 by constructing an adjustment signal, and applying the adjustment signal to a variable resistor of I path or Q path. For example, the adjustment signal may be constructed according to Eq (3), as a linear combination.

Figure 8:
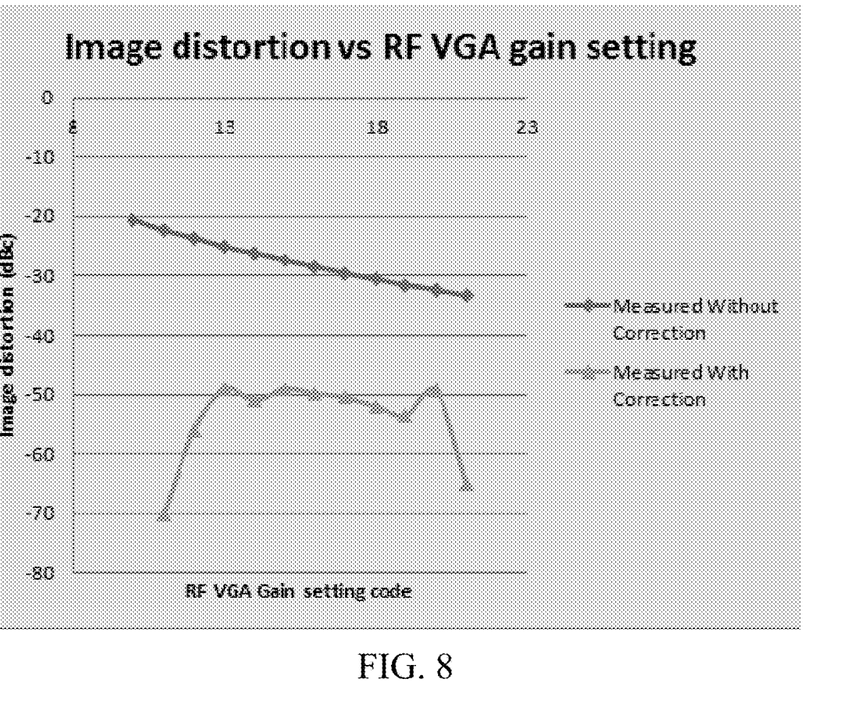
FIG. 8 is a plot showing measurement results with and without measurement adjustments.

FIG. 8 is a plot 800 showing measurement results with and without a measurement adjustment. The upper line shows the measurement result without measurement adjustment. The lower line shows the measurement result with the measurement adjustment. Therefore, significant image distortion reduction is observed with the measurement adjustment applied.

The example techniques correct RF gain dependent image distortion at the root, i.e., correcting IQ path mismatch directly. This yields a more effective RF gain dependent image distortion reduction.

The example techniques adopts a calibration algorithm which simplifies the calibration procedure and measures less number of points. As such, calibration time is reduced and cost reduction is obtained. In addition, the example techniques provide a more cost-effective option (e.g., in terms of both economic cost and development time) to reduce image distortion caused by the IQ path mismatch. For example, the example techniques reduce the calibration time needed which is cost saving. The example techniques alleviate and avoid the cost and complexity in designing power amplifiers, radio frequency (RF)/analog transceivers, and additional filtering in RF front-end in the analog domain. Further, the example techniques avoid non-perfect matched RF/analog circuits, front-end filter loss, and worse sensitivity associated with the analog approaches. The example techniques may be applied without lowering the TX output power so as to make design of the analog filter within a linear response region, and therefore do not sacrifice cell coverage. In addition, the example techniques may provide a more accurate, effective, and flexible solution by estimating and celling the distortion without adding complicated digital correction circuit, and allowing real-time or on-demand calibration and modification of the estimation and adjustment coefficients and models.

Implementations of the subject matter and the operations described in this disclosure may be implemented in digital electronic circuitry, or in computer software, firmware, or hardware, including the structures disclosed in this disclosure and their structural equivalents, or in combinations of one or more of them. Implementations of the subject matter described in this disclosure may be implemented as one or more computer programs, i.e., one or more modules of computer program instructions, encoded on computer storage medium for execution by, or to control the operation of, data processing apparatus. Alternatively or in addition, the program instructions may be encoded on an artificially-generated propagated signal, for example, a machine-generated electrical, optical, or electromagnetic signal that is generated to encode information for transmission to suitable receiver apparatus for execution by a data processing apparatus. A computer storage medium, for example, the computer-readable medium, may be, or be included in, a computer-readable storage device, a computer-readable storage substrate, a random or serial access memory array or device, or a combination of one or more of them. Moreover, while a computer storage medium is not a propagated signal, a computer storage medium may be a source or destination of computer program instructions encoded in an artificially-generated propagated signal. The computer storage medium may also be, or be included in, one or more separate physical and/or non-transitory components or media (for example, multiple CDs, disks, or other storage devices).

In some implementations, the operations described in this disclosure may be implemented as a hosted service provided on a server in a cloud computing network. For example, the computer-readable storage media may be logically grouped and accessible within a cloud computing network. Servers within the cloud computing network may include a cloud computing platform for providing cloud-based services. The terms "cloud," "cloud computing," and "cloud-based" may be used interchangeably as appropriate without departing from the scope of this disclosure. Cloud-based services may be hosted services that are provided by servers and delivered across a network to a client platform to enhance, supplement, or replace applications executed locally on a client computer. The circuit may use cloud-based services to quickly receive software upgrades, applications, and other resources that would otherwise require a lengthy period of time before the resources may be delivered to the circuit.

The operations described in this disclosure may be implemented as operations performed by a data processing apparatus on data stored on one or more computer-readable storage devices or received from other sources. The term "data processing apparatus" encompasses all kinds of apparatus, devices, and machines for processing data, including by way of example a programmable processor, a computer, a system on a chip, or multiple ones, or combinations, of the foregoing. The apparatus may include special purpose logic circuitry, for example, an FPGA (field programmable gate array) or an ASIC (application-specific integrated circuit). The apparatus may also include, in addition to hardware, code that creates an execution environment for the computer program in question, for example, code that constitutes processor firmware, a protocol stack, a database management system, an operating system, a cross-platform runtime environment, a virtual machine, or a combination of one or more of them. The apparatus and execution environment may realize various different computing model infrastructures, such as web services, distributed computing and grid computing infrastructures.

A computer program (also known as a program, software, software application, script, or code) may be written in any form of programming language, including compiled or interpreted languages, declarative or procedural languages, and it may be deployed in any form, including as a stand-alone program or as a module, component, subroutine, object, or other unit suitable for use in a computing environment. A computer program may, but need not, correspond to a file in a file system. A program may be stored in a portion of a file that holds other programs or data (for example, one or more scripts stored in a markup language document), in a single file dedicated to the program in question, or in multiple coordinated files (for example, files that store one or more modules, sub-programs, or portions of code). A computer program may be deployed to be executed on one computer or on multiple computers that are located at one site or distributed across multiple sites and interconnected by a communication network.

The processes and logic flows described in this disclosure may be performed by one or more programmable processors executing one or more computer programs to perform actions by operating on input data and generating output. The processes and logic flows may also be performed by, and apparatus may also be implemented as, special purpose logic circuitry, for example, an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, for example, magnetic, magneto-optical disks, or optical disks. However, a computer need not have such devices. Moreover, a computer may be embedded in another device, for example, a mobile telephone, a personal digital assistant (PDA), a mobile audio or video player, a game console, a Global Positioning System (GPS) receiver, or a portable storage device (for example, a universal serial bus (USB) flash drive), to name just a few. Devices suitable for storing computer program instructions and data include all forms of non-volatile memory, media and memory devices, including by way of example semiconductor memory devices, for example, EPROM, EEPROM, and flash memory devices; magnetic disks, for example, internal hard disks or removable disks; magneto-optical disks; and CD-ROM and DVD-ROM disks. The processor and the memory may be supplemented by, or incorporated in, special purpose logic circuitry.

To provide for interaction with a user, implementations of the subject matter described in this disclosure may be implemented on a computer having a display device, for example, a CRT (cathode ray tube) or LCD (liquid crystal display) monitor, for displaying information to the user, and a keyboard, a pointing device, for example, a mouse or a trackball, or a microphone and speaker (or combinations of them) by which the user may provide input to the computer. Other kinds of devices may be used to provide for interaction with a user as well; for example, feedback provided to the user may be any form of sensory feedback, for example, visual feedback, auditory feedback, or tactile feedback; and input from the user may be received in any form, including acoustic, speech, or tactile input. In addition, a computer may interact with a user by sending documents to and receiving documents from a device that is used by the user; for example, by sending web pages to a web browser on a user's client device in response to requests received from the web browser.

Implementations of the subject matter described in this disclosure may be realized in a computing system that includes a back-end component, for example, a data server, or that includes a middleware component, for example, an application server, or that includes a front-end component, for example, a client computer having a graphical user interface or a Web browser through which a user may interact with an implementation of the subject matter described in this disclosure, or any combination of one or more such back-end, middleware, or front-end components. The components of the system may be interconnected by any form or medium of digital data communication, for example, a communication network. Examples of communication networks include a local area network ("LAN") and a wide area network ("WAN"), an inter-network (for example, the Internet), and peer-to-peer networks (for example, ad hoc peer-to-peer networks).

The computing system may include clients and servers. A client and server are generally remote from each other and typically interact through a communication network. The relationship of client and server arises by virtue of computer programs running on the respective computers and having a client-server relationship to each other. In some implementations, a server transmits data (for example, an HTML page) to a client device (for example, for purposes of displaying data to and receiving user input from a user interacting with the client device). Data generated at the client device (for example, a result of the user interaction) may be received from the client device at the server.

While this disclosure contains many specific implementation details, these should not be construed as limitations on the scope of any implementations or of what may be claimed, but rather as descriptions of features specific to particular implementations of particular implementations. Certain features that are described in this disclosure in the context of separate implementations may also be implemented in combination in a single implementation. Conversely, various features that are described in the context of a single implementation may also be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products.

Thus, particular implementations of the subject matter have been described. Other implementations are within the scope of the following claims. In some cases, the actions recited in the claims may be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A method performed by a wireless terminal including a transceiver, the method comprising:
    measuring, by the wireless terminal, a first gain mismatch of I path and Q path of the transceiver having a first RF gain setting, a second gain mismatch of I path and Q path of the transceiver having a second RF gain setting, and a third gain mismatch of I path and Q path of the transceiver having a third RF gain setting;
    estimating, by the wireless terminal, a value of an IQ mismatch coefficient based on the first gain mismatch, the second gain mismatch and the third gain mismatch; and
    applying, by the wireless terminal, a measurement adjustment to I path or Q path based on the value of the IQ mismatch coefficient to reduce an image distortion,
    wherein the estimating the value of the IQ mismatch coefficient comprises:
    estimating, by the wireless terminal, a value of a static gain mismatch coefficient based on the first gain mismatch and the second gain mismatch; and
    estimating, by the wireless terminal, the value of the IQ mismatch coefficient based on the static gain mismatch coefficient and the third gain mismatch.

2. The method of claim 1, wherein when gs represents the static gain mismatch coefficient, $$gs = \frac{Gmis1 * N2 - Gmis2 * N1}{N2 - N1}$$

wherein Gmis1 represents the first gain mismatch, Gmis2 represents the second gain mismatch, N1 represents a parameter corresponding to the first RF gain setting, and N2 represents a parameter corresponding to the second RF gain setting.

3. The method of claim 2, wherein when ε represents the IQ mismatch coefficient, $$\varepsilon = \frac{a * G3 - G1}{a - 1}$$

wherein $$a = \frac{G1-1}{G3-1} * \frac{N3}{N1}, G1 = Gmis1/gs, G3 = Gmis3/gs$$

and wherein Gmis3 represents the third gain mismatch, and N3 represents a parameter corresponding to the third RF gain setting.

4. The method of claim 2, wherein when ε represents the IQ mismatch coefficient, $$\varepsilon = \frac{a*G3 - G2}{a-1}$$

wherein $$a = \frac{G2-1}{G3-1} * \frac{N3}{N2}, G2 = Gmis2/gs, G3 = Gmis3/gs$$

and wherein Gmis3 represents the third gain mismatch, N3 represents a parameter corresponding to the third RF gain setting.

5. The method of claim 1, wherein the measuring the first gain mismatch of I path and Q path comprises:
transmitting, by the wireless terminal, a first signal by a transmitter of the wireless terminal;
detecting, by the wireless terminal, a second signal by a receiver of the wireless terminal, the second signal comprising distortion caused by I path and Q path mismatch; and
estimating, by the wireless terminal, the first gain mismatch of I path and Q path based on the second signal.

6. The method of claim 1, wherein the estimating the value of an IQ mismatch coefficient comprises estimating the value of an IQ mismatch coefficient in a factory calibration phase based on a calibration theory.

7. The method of claim 1, further comprising:
prior to estimating the value of the IQ mismatch coefficient, determining that the image distortion is caused by a gain mismatch between I path and Q path, and the gain mismatch between I path and Q path is related to a RF gain setting.

8. The method of claim 7, wherein when Gmis represents the gain mismatch:

$$Gmis = \frac{Gain_q}{Gain_I} = gs * \frac{1 + R*N}{1 + R*N*\varepsilon}$$

wherein $Gain_q$ represents a gain of the Q path, $Gain_I$ represents a gain of the I path, gs represents a static gain mismatch coefficient, ε represents the IQ mismatch coefficient, N represents a parameter corresponding to a gain setting, R=r/r0, and wherein r is a value of a resistor; r0 is a value of a resistor load (Rload) when N=1, or, r0 is determined by a circuit design and is a constant value.

9. The method of claim 1, wherein the applying the measurement adjustment to I path or Q path comprises:
constructing an adjustment signal based on the value of the IQ mismatch coefficient; and
applying the adjustment signal to a variable resistor of I path or Q path.

10. A wireless terminal, comprising:
a digital baseband circuitry; and
a transceiver,
wherein the transceiver having a first RF gain setting is configured to send a first measurement to the digital baseband circuitry, the transceiver having a second RF gain setting is configured to send a second measurement to the digital baseband circuitry, and the transceiver having a third RF gain setting is configured to send a third measurement to the digital baseband circuitry,
wherein the digital baseband circuitry is configured to measure a first gain mismatch of I path and Q path of the transceiver based on the first measurement, a second gain mismatch of I path and Q path of the transceiver based on the second measurement, and a third gain mismatch of I path and Q path of the transceiver based on the third measurement,
wherein the digital baseband circuitry is further configured to estimate a value of an IQ mismatch coefficient based on the first gain mismatch, the second gain mismatch and the third gain mismatch, and to apply a measurement adjustment to the I path or the Q path based on the value of the IQ mismatch coefficient, and
wherein the digital baseband circuitry is configured to estimate a value of a static gain mismatch coefficient based on the first gain mismatch and the second gain mismatch, and estimate the value of the IQ mismatch coefficient based on the static gain mismatch coefficient and the third gain mismatch.

11. The wireless terminal of claim 10, wherein the transceiver is further configured to transmit a first signal, and detect a second signal including a distortion caused by I path and Q path mismatch, and wherein the digital baseband circuitry is configured to estimate the first gain mismatch of I path and Q path based on the second signal.

12. The wireless terminal of claim 10, wherein the transceiver comprises a variable resistor, and wherein the digital baseband circuitry is configured to construct an adjustment signal based on the value of the IQ mismatch coefficient, and apply the adjustment signal to the variable resistor.

13. The wireless terminal of claim 10, wherein the transceiver comprises a variable resistor and a mixer, and wherein the variable resistor is located at an input of the mixer.

14. A digital baseband circuitry, comprising:
a non-transitory memory storage comprising instructions;
one or more processors in communication with the memory, wherein the one or more processors execute the instructions to:
measure a first gain mismatch of I path and Q path of a transceiver having a first RF gain setting, a second gain mismatch of I path and Q path of the transceiver having a second RF gain setting, and a third gain mismatch of I path and Q path of the transceiver having a third RF gain setting;
estimate, a value of an IQ mismatch coefficient based on the first gain mismatch, the second gain mismatch and the third gain mismatch;
estimate a value of a static gain mismatch coefficient based on the first gain mismatch and the second gain mismatch;
estimate the value of the IQ mismatch coefficient based on the static gain mismatch coefficient and the third gain mismatch; and apply a measurement adjustment to the I path or the Q path based on the value of the IQ mismatch coefficient to reduce an image distortion.

15. The circuitry of claim 14, wherein when gs represents the static gain mismatch coefficient, $$gs = \frac{Gmis1 * N2 - Gmis2 * N1}{N2 - N1}$$

Gmis1 represents the first gain mismatch, Gmis2 represents the second gain mismatch, N1 represents a parameter corresponding to the first RF gain setting, and N2 represents a parameter corresponding to the second RF gain setting.

16. The circuitry of claim 15, wherein when ε represents the IQ mismatch coefficient, $$\varepsilon = \frac{a * G3 - G1}{a - 1}$$

wherein $$a = \frac{G1 - 1}{G3 - 1} * \frac{N3}{N1}, \; G1 = Gmis1/gs, \; G3 = Gmis3/gs$$

and wherein Gmis3 represents the third gain mismatch, N3 represents a parameter corresponding to the third RF gain setting.

17. The circuitry of claim 14, wherein the one or more processors execute the instructions to construct an adjustment signal based on the value of the IQ mismatch coefficient, and apply the adjustment signal to a variable resistor of the transceiver.

\* \* \* \* \*